United States Patent [19]

Prentakis

[11] Patent Number: 4,775,281

[45] Date of Patent: Oct. 4, 1988

[54] APPARATUS AND METHOD FOR LOADING AND UNLOADING WAFERS

[75] Inventor: Antonios E. Prentakis, Cambridge, Mass.

[73] Assignee: Teradyne, Inc., Boston, Mass.

[21] Appl. No.: 936,825

[22] Filed: Dec. 2, 1986

[51] Int. Cl.[4] ............................................. B65G 1/00
[52] U.S. Cl. .................................. 414/416; 414/786; 414/752; 414/754; 414/757; 414/627; 414/331; 414/281; 414/280; 414/225; 414/217; 414/661; 118/729; 118/500
[58] Field of Search ............... 414/416, 417, 331, 786, 414/225, 226, 217, 222, 618, 280, 754, 749, 750, 751, 752, 626, 627, 659, 661, 279, 277, 281, 757; 118/729, 730, 500

[56] References Cited

U.S. PATENT DOCUMENTS

| | | | |
|---|---|---|---|
| 3,823,836 | 7/1974 | Cheney et al. | 414/331 X |
| 3,868,759 | 3/1975 | Hartleroad et al. | 414/754 X |
| 4,457,661 | 7/1984 | Flint et al. | 414/404 |
| 4,465,416 | 8/1984 | Burkhalter et al. | 414/217 |
| 4,558,983 | 12/1985 | Freeman et al. | 414/331 |
| 4,618,292 | 10/1986 | Judge et al. | 406/19 |

OTHER PUBLICATIONS

W. T. Anderson, "Workpiece Transfer Unit", Apr. 1976, IBM Technical Disclosure Bull.

Primary Examiner—Frank E. Werner

[57] ABSTRACT

Apparatus for loading and unloading wafers including a support structure having associated with it a predetermined wafer engagement position at which wafers can be engaged by the processing machine, a temporary storage device mounted on the support structure for storing a wafer in position for pick up, the flat surfaces of the wafer being parallel to an X-axis and perpendicular to a Z-axis, a first wafer engagement member for carrying the wafer on the first engagement member between the temporary storage device and the engagement position, a first X-direction mover mounted on the support structure and operable to move the first engagement member parallel to the X-axis, a second wafer engagement member for carrying the wafer on the second engagement member between the temporary storage device and the engagement position, a second X-direction mover mounted on the support structure and operable to move the second engagement member parallel to the X-axis independent of the first engagement member, a Z-direction mover mounted on the support structure and operable to move the first and second engagement members in the Z-direction, and a controller to cause the first X-direction mover to move the first engagement member parallel to the X-axis toward the engagement position at the same time as or shortly after the second engagement member moves parallel to said X-axis away from the engagement position.

16 Claims, 2 Drawing Sheets

APPARATUS AND METHOD FOR LOADING AND UNLOADING WAFERS

FIELD OF THE INVENTION

The invention relates to automatically loading and unloading a wafer processing machine.

BACKGROUND OF THE INVENTION

Most semiconductor wafer processing machines, especially in the later stages of integrated circuit manufacture, work on one wafer at a time, typically holding the wafer on a vacuum chuck. In general, however, lots of approximately 25 to 50 wafers are delivered to the machine at one time, contained in one or two cassettes. Cassettes are magazines having regularly spaced slots, carrying one wafer per slot. It is important to prevent the wafers from contacting each other or other objects because the circuits etched on their upper surfaces are extremely delicate and prone to contamination by small particles.

In modern fabrication facilities, great emphasis is placed on limiting the presence of human operators in the processing area, because humans are the major source of contaminating particles. Thus most process machines are provided with automatic loaders which extract wafers one at a time from the cassettes, move the wafers into position to be engaged by the processing machines, and return the processed wafers to the cassettes, all without human intervention.

The two major operations involved in automatic cassette-to-cassette wafer handling are wafer transport between cassettes and the loader and wafer exchange between the loader and the process machine. The traditional loading mechanism structure includes conveyor belts and elevators dedicated to input and output cassettes: the input cassette elevator lowers the input cassette until the bottom unprocessed wafer is on the input conveyor belt, allows it to be transported out of the cassette onto the belt, and lowers again to bring the next wafer onto the belt. The reverse procedure allows processed wafers to be transported from the output belt into the output cassette. In general, wafer transport between the conveyor belts and the process machine chuck is accomplished by a completely different mechanism, e.g., a rotary shuttle arm. Two drawbacks of this approach are the cost of providing an elevator mechanism for each cassette and the inability to access wafers at random.

An alternative approach that is becoming more popular is the use of robots with appropriate end effectors (e.g., vacuum wands) to extract wafers from the cassettes, place them directly onto the process machine chuck, remove them directly from the process machine chuck after processing, and return them to the same or a different slot of the cassettes. This allows for random access of wafers and eliminates the need for cassette elevators.

Two vacuum wands have been used on opposite ends of a support member that is rotatably mounted on the end of a robot arm so that a processed wafer can be removed from the processing mmachine with one wand and an unprocessed wafer can be immediately dropped off at the processing machine by rotating the other wand into position, without the necessity of another trip to the cassette and back, to increase the time that the processing machines is at work. The robot returns the processed wafer to a cassette, picks up an unprocessed wafer (also doing gross wafer flat alignment adjustments if desired), and can return to the vicinity of the processing machine while the pocessing machine is doing its work and wait there for the next wafer exchange.

SUMMARY OF THE INVENTION

I have discovered that by employing two wafer engagement members that are independently, linearly movable parallel to an X-axis into a wafer engagement position in a processing machine, one can obtain a quick exchange between successive wafers by picking a processed wafer up with one engagement member and immediately thereafter dropping off an unprocessed wafer with the other, without the need for a return trip to the cassette and without the large space and complexity required to rotate a single robot arm having two engagement portions.

In preferred embodiments the two wafer engagement members are both carried by a carriage that is movable along a Z-axis perpendicular to the X-axis, to move the engagement members from the temporary storage device to a position even with the engagement position of the processing machine; there is an alignment station at which the wafers can be angularly adjusted prior to transport to the processing machine; and the wafers can be returned to the same or a different cassette slot.

Other advantages and features of the invention will be apparent from the following description of the preferred embodiment thereof and from the claims.

DESCRIPTION OF THE PREFERRED EMBODIMENT

The preferred embodiment will now be described.

DRAWINGS

STRUCTURE

Figure 1:
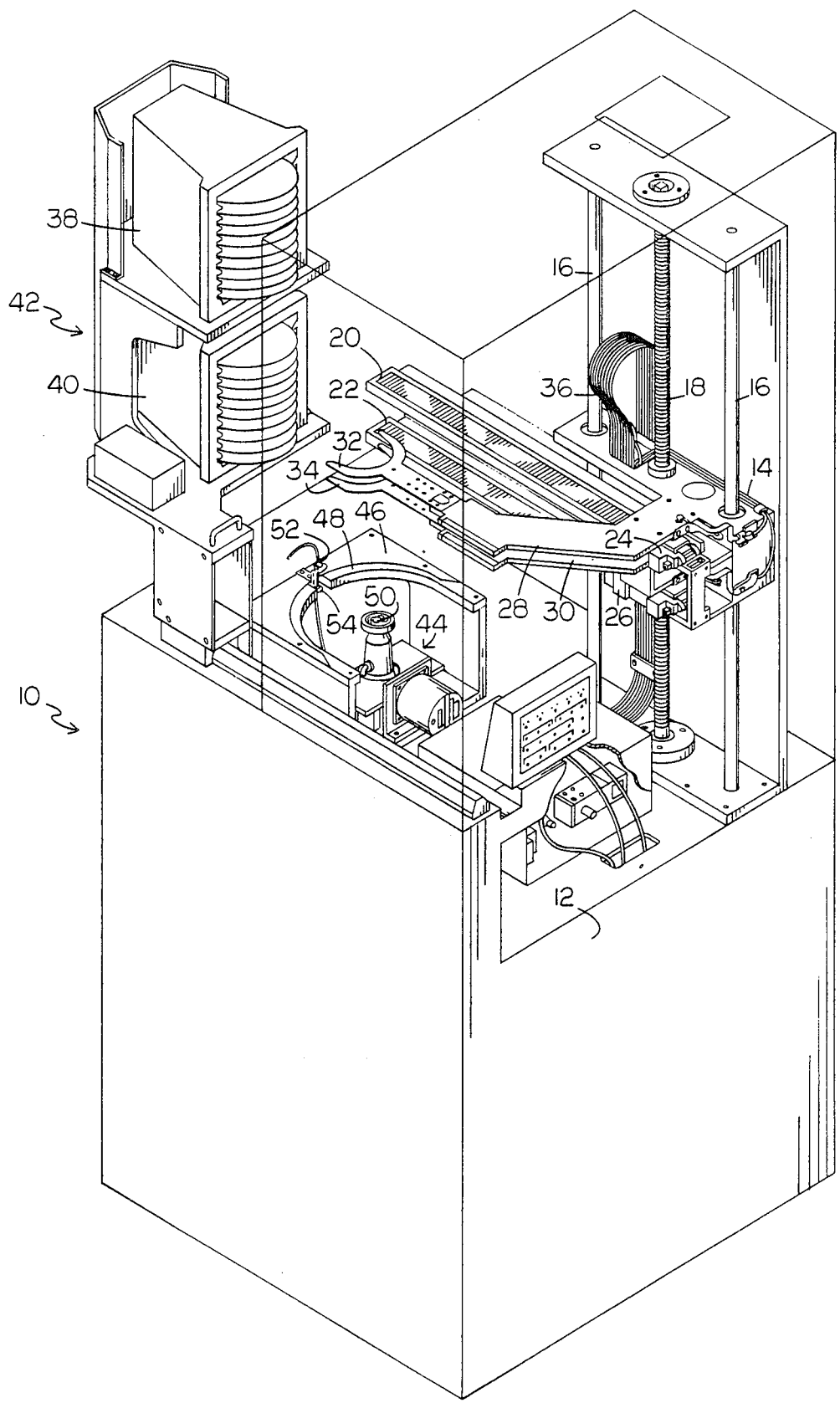
FIG. 1 is a perspective view of wafer loading and unloading apparatus according to the invention.

Referring to FIG. 1, there is shown wafer loading and unloading apparatus 10, including frame 12, which provides a support structure for the apparatus. Carriage 14 is slidably mounted on guide bars 16 mounted on frame 12 and threadedly connected to be driven vertically along the Z-axis by lead screw 18, which is rotatably operated by a computer-controlled stepper motor (not shown). On carriage 14 are mounted upper horizontal track 20 and lower horizontal track 22 (both parallel to the X-axis), on which operate two independent computer-controlled linear stepper motors 24 and 26, respectively. Each linear motor 24, 26 carries an arm 28, 30, each arm terminating in a U-shaped vacuum wand 32, 34. The wands are provided with vacuum through tubing harness 36, the vacuum to each wand being controlled independently by a solenoid-operated valve (not shown) under computer control. A semiconductor wafer may be carried on the upper surface of each wand, its back (non-circuit) side being secured to the wand by means of the vacuum applied to the wafer at an orifice in the upper surface of the wand near the the bottom of the U-shaped portion. The wafers are housed in cassettes 38, 40, accommodated in cassette carrier assembly 42.

Figure 2:
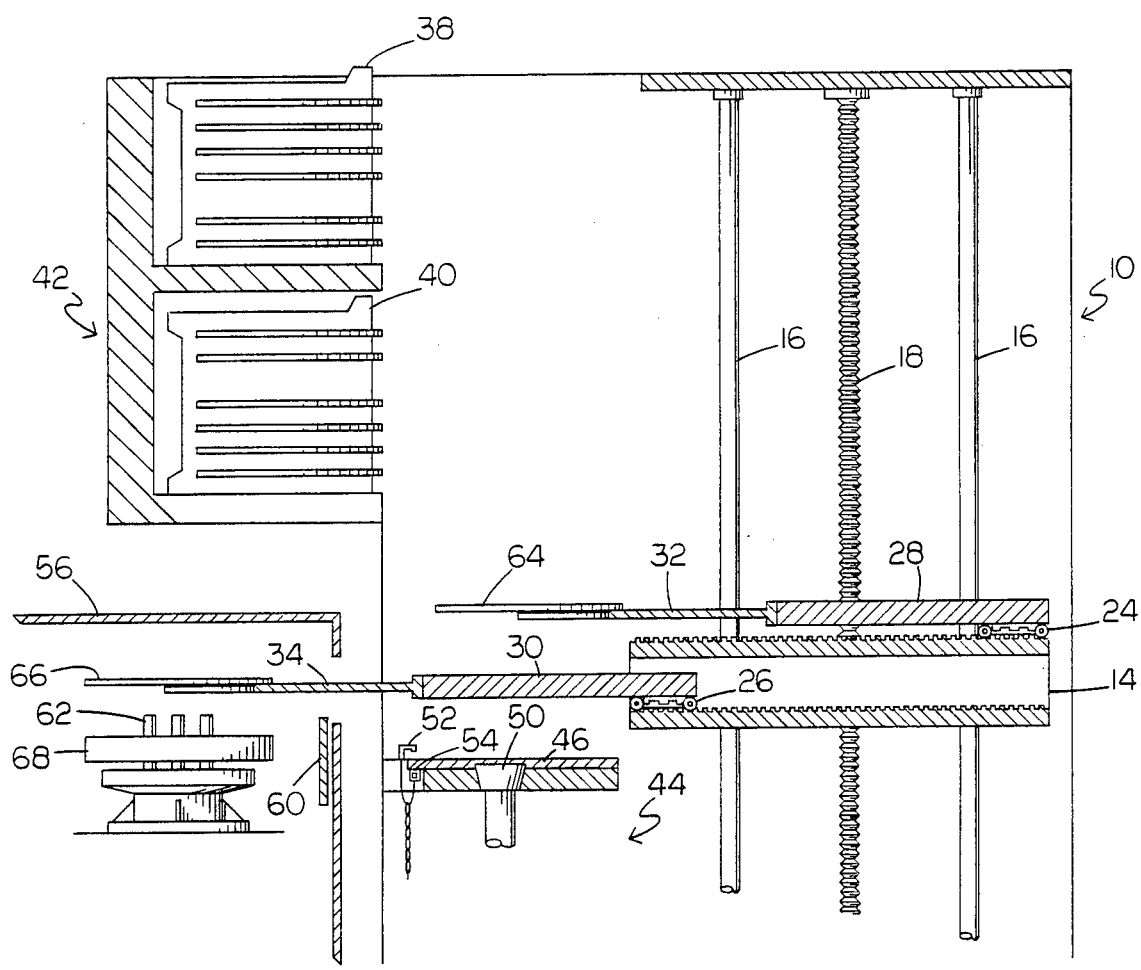
FIG. 2 is a diagrammatic partial side elevation showing a vacuum wand of the FIG. 1 apparatus in position to transfer a wafer to a processing machine.

Alignment station 44 is provided for rotating the wafers prior to delivery to the process machine (which is located behind apparatus 10 and includes a portion under carrier assembly 42 as shown in FIG. 2) to provide desired angular orientation. Alignment station 44 includes a guide plate 46 having a recessed semicircular ledge 48 against which a wafer may be registered by a vacuum wand. Station 44 also includes alignment vacuum chuck 50 for rotating the wafer, the circular periphery of the wafer interrupting the light beam from photoemitter 52 to photodetector 54 until the fiducial (either a flat or a notch in the periphery of the wafer) is rotated past the photodetector.

Referring to FIG. 2, wafer loading and unloading apparatus 10 is shown in position adjacent to laser trimming process machine 56 (shown quite diagrammatically in FIG. 2), including process vacuum chuck 58 located behind door 60 through which wands 32, 34 can extend. Process vacuum chuck 58 includes three pins 62, which can be raised above chuck 58 (as shown in FIG. 2) into a wafer engagement position for exchanging wafers with wands 32, 34.

The locations (i.e., Z and X coordinates) of the slots of cassettes 38, 40 in which wafers are present, the location of guide plate 46 of alignment station 44, and the location of process chuck 58 are programmed into the memory of the controlling computer. Once the required positions have been programmed, no further human intervention is required except to install and remove cassettes.

Operation

In operation, carriage 14 is driven via rotating lead screw 18 to the appropriate height for upper vacuum wand 32 to be inserted into the space below the wafer in the desired slot of the appropriate cassette 38 or 40, and upper wand 32 is inserted into the space (horizontally along the X-axis) to the position under the wafer via its linear stepper motor 24 travelling along track 20 while lower wand 34 remains retracted. Carriage 14 is raised by a small amount so that wand 32 contacts the wafer above it, and vacuum secures the wafer to the vacuum wand 32, which is withdrawn, carrying the wafer with it.

Carriage 14 descends, bringing the wafer to the level of guide plate 46. Wand 32 then extends forward by the small amount necessary to drive the wafer into contact with the semicircular ledge. Vacuum to wand 32 is turned off, and carriage 14 is lowered by a small amount to let wand 32 drop clear of the wafer. The wafer is engaged by vacuum chuck 50, which is then rotated so that the periphery of the wafer passes between photoemitter 52 and photodetector 54 to locate the flat or notch, and then rotated to the correct angular orientation, if different than the position of the photodetector, by vacuum chuck 50. Vacuum is again turned on to upper wand 32, and carriage 14 rises so that upper wand 32 picks up the now correctly oriented wafer.

Carriage 14 is vertically moved along the Z-axis to the appropriate height for lower vacuum wand 34 to pick up a processed wafer from process chuck 58 of laser trimming process machine 56. In general, vacuum wand 34 (which is not carrying a wafer at this point in the process) waits at this position for processing of the previous wafer to be completed. When it is, pins 62 raise processed wafer 66, and lower vacuum wand 34 travels (via its linear stepper motor 26 travelling along track 24) through the opening at door 60 into process machine 56 under process wafer 66, picks it up and retreats from the machine. Carriage 14 then moves vertically slightly so that the properly oriented, unprocessed wafer 64, which is carried by wand 32, is now at the proper height. Wand 32 travels into machine 56 and deposits wafer 64 on pins 62, which lower wafer 64 onto process chuck 58. FIG. 2 shows unprocessed wafer 64 in position just prior to transfer to chuck 58. Upper wand 32 is withdrawn, and processing of new wafer 64 by machine 56 now commences.

At this point, only lower vacuum wand 34 is carrying a wafer (processed wafer 66), and both arms 28, 30 and their wands 32, 34 are in retracted positions. Carriage 14 then rises, positioning lower wand 34 at the height of the appropriate cassette slot for depositing of processed wafer 66. (This may be the slot from which the wafer originally was extracted, or some other slot as desired.) Processed wafer 66 is inserted into its slot, lower wand 34 is retracted, and the next unprocessed wafer may now be accessed and withdrawn from its cassette slot by upper wand 32, thus resuming the cycle from the beginning.

The dual arms and wands of the apparatus and their independent linear drivers allow for quick exchange of successive wafers at process chuck 58, thus minimizing idle time of the main process (in this case laser repair of redundant memories.) Also, as the wands are simply linearly moved into position in processing machine 56, only a small amount of space is required to provide access for them. Carriage 14 advantageously provides vertical movement for both wands, avoiding the complexity that would be required for independent vertical movement mechanisms. By simply providing new coordinates, different cassettes and processing machines can be accommodated.

Other Embodiments

Other embodiments of the invention are within the scope of the following claims. E.g., apparatus 10 can be used with probers and other wafer process machines than laser trimmers.

What is claimed is:

1. Apparatus for transporting wafers between a temporary storage device and a processing machine comprising a support structure having associated with it a predetermined wafer engagement position at which wafers having flat surfaces can be engaged by said processing machine, a temporary storage device mounted on said support structure for temporarily storing a wafer in a known position for pick up, said flat surfaces of said wafer being parallel to an X-axis and perpendicular to a Z-axis, a first wafer engagement member for gripping, lifting and carrying a said wafer on said first engagement member between said temporary storage device and said engagement position, a first X-direction mover mounted on said support structure and operable to move said first engagement member parallel to said X-axis, a second wafer engagement member for gripping, lifting and carrying a said wafer on said second engagement member between said temporary storage device and said engagement position, a second X-direction mover mounted on said support structure and operable to move said second engagement member parallel to said X-axis independent of said first engagement member, a Z-direction mover mounted on said support structure and operable to move said first and second engagement members parallel to the Z-axis, an alignment station carried by said support structure for placing said wafer in desired position to be received at said processing station, a said wafer being transportable to said alignment station by a said wafer engagement member, and a controller to cause said first X-direction mover to move said first engagement member and an unprocessed wafer carried by it parallel to said X-axis toward said engagement position at the same time as or shortly after said second engagement member and a processed wafer carried by it moves parallel to said X-axis away from said engagement position, said controller also causing an unprocessed wafer to be carried to, aligned at and removed from said alignment station while another said wafer is being processed at said processing machine.

2. The apparatus of claim 1 wherein said Z-direction mover comprises a carriage that is movable along the Z-axis and carries said first and second X-direction movers, said first and second engagement members being movable along first and second axes that are fixed with respect to said carriage, are parallel to said X-axis, and are spaced from each other by a fixed distance along said Z-axis.

3. The apparatus of claim 2 wherein said Z-direction mover comprises a lead screw having a longitudinal axis that is parallel to said Z-axis and is rotatably driven with respect to a threaded member of said carriage.

4. The apparatus of claim 2 wherein said first and second wafer engagement members comprise flat vacuum wands that engage said wafers at their back surfaces.

5. The apparatus of claim 4 wherein said vacuum wands are U-shaped.

6. The apparatus of claim 4 wherein said X-axis is aligned with the horizontal, said back surfaces of said wafers are at the bottom, and said wands engage said wafers from underneath.

7. The apparatus of claim 1 wherein said alignment station includes a member operable to engage a said wafer at the center of its back surface and to rotate the wafer to a desired angular orientation.

8. The apparatus claim 7 wherein said first and second wafer engagment members comprise flat vacuum wands that engage said wafers at their back surfaces.

9. The apparatus of claim 8 wherein said vacuum wands are U-shaped.

10. A method of transporting wafers between a temporary storage device and a processing machine comprising providing a temporary storage device for temporarily storing a wafer in position for pick up, the flat surfaces of the wafer being parallel to an X-axis and perpendicular to a Z-axis, first and second wafer engagement members, first and second X-direction movers for independently moving the first and second wafer engagement members parallel to the X-axis, a Z-direction mover for moving the first and second wafer engagement members parallel to the Z-axis, and an alignment station carried by said support structure for placing said wafer in desired position to be received at said processing station, picking up by gripping and lifting a first, unprocessed wafer at said storage device with said first wafer engagement member, causing said first unprocessed wafer to be carried to, aligned at and removed from said alignment station, said picking up and causing being carried out while another said wafer is being processed at said processing machine, moving said second wafer engagement member parallel to said X-axis to a wafer engagement position in said processing machine at which said another wafer is located, engaging by gripping and lifting said another wafer by said second wafer engagement member, said another wafer being a processed wafer, removing said second wafer engagement member and engaged processed wafer from said processing machine parallel to said X-axis, moving said first wafer engagement member and engaged unprocessed wafer parallel to said X-axis to said wafer engagement position, disengaging said unprocessed wafer from said first wafer engagement member, and removing said first wafer engagement member without said unprocessed wafer parallel to said X-axis.

11. The method of claim 10 wherein said providing includes providing a carriage which is movable along said Z-axis and which carries said first and second X-direction movers, and further comprising, after said picking up, moving said carriage along said Z-axis from a position even with said storage device to a position even with said engagement position to bring said second wafer engagement member in alignment with said engagement position prior to said moving said second wafer engagement member.

12. The method of claim 11 further comprising moving said carriage along said Z-axis to bring said first engagement member even with said engagement position after said removing said second engagement member, and, after said removing said first engagement member, moving said carriage along said Z-axis to bring said second engagement member and attached wafer even with said storage device and moving said second engagement member and attached processed wafer along an axis parallel to said X-axis to said storage device.

13. The method of claim 12 further comprising removing said first wafer from said processing machine and returning it to said storage device.

14. The method of claim 13 wherein said returning comprises returning said first wafer to the location of said storage device from which it had been removed.

15. The method of claim 13 wherein said returning comprises returning said first wafer to a different location of said storage device than the location from which it had been removed.

16. The method of claim 15 wherein said storage device comprises a plurality of cassettes with slots for receiving wafers, and wherein said first wafer is returned to a slot of a different cassette than the cassette from which it had been removed.

* * * * *